(12) United States Patent
Helke

(10) Patent No.: US 6,692,651 B2
(45) Date of Patent: *Feb. 17, 2004

(54) HIGH-PERFORMANCE PIEZOELECTRIC CERAMIC

(75) Inventor: Guenter Helke, Lauf (DE)

(73) Assignee: Leramtec AG Innovative Ceramic Engineering, Plochingen (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/486,001

(22) PCT Filed: Aug. 27, 1998

(86) PCT No.: PCT/EP98/05439

§ 371 (c)(1),
(2), (4) Date: Feb. 18, 2000

(87) PCT Pub. No.: WO99/12865

PCT Pub. Date: Mar. 18, 1999

(65) Prior Publication Data

US 2002/0190237 A1 Dec. 19, 2002

(30) Foreign Application Priority Data

Sep. 5, 1997 (DE) .......................................... 197 38 793

(51) Int. Cl.⁷ ...................... C04B 35/491; H01L 41/187
(52) U.S. Cl. ................ 252/62.9 PZ; 501/134; 501/136; 501/135; 310/311
(58) Field of Search .................. 252/62.9 PZ; 501/134, 501/135, 136; 310/311

(56) References Cited

U.S. PATENT DOCUMENTS 2,708,244 A * 5/1955 Jaffe .................... 252/62.9 PZ
4,087,366 A * 5/1978 Tanaka et al. ........ 252/62.9 PZ

FOREIGN PATENT DOCUMENTS

JP 57160965 A * 10/1982

OTHER PUBLICATIONS

Derwent abstract for JP 73–14837 B, 1973.*

Lucien Eyraud et al, "Journal of Solid State Chemistry, 53", *Influence of Simultaneous Heterovalent Substitutions in Both Cationic Sites on the Ferroelectric Properties of PZT Type Cermics,* pp. 266–272, (1984).

Lucien Eyraud et al., "Advanced Ceramic Materials, vol. 1, No. 3", *Current Research in the Field of PZT Ceramics and Ferroelectric Polymers,* pp. 223–231, (1986).

Lucien Eyraud et al, "Ferroelectrics, vol. 50", *Effect of Simultaneous Heterovalent Substitutions on Both Cationic Sites on the Electrical Conductivity and Ageing of PZT Type Ceramics,* pp. 103–110, (1983).

Ohanessian et al.; "Caractérisation de la Stabilité d'un Élément Piézoélectrique du Type PZT Sous Compression Uniaxiale Rapide"; Revue Phys. Appl.; vol. 18, 1983; p. 479.

* cited by examiner

Primary Examiner—C. Melissa Koslow
(74) Attorney, Agent, or Firm—Foley & Lardner

(57) ABSTRACT

The invention relates to piezoelectric ceramic materials consisting of lead zirconate titanate and (1) at least one of an alkaline earth pyrochlore and an alkali metal perovskite having the formula $AB^{5+}O_3$, where B is Nb, Ta, or Sb; or (2) an alkaline earth alkali metal perovskite having the formula $A(T^{1+}_{0.25}B^{5+}_{0.75})O_3$, where A is the alkaline earth metal, T is the alkali metal, and B is Nb, Ta, or Sb. The materials are characterized by excellent heat and time stability.

12 Claims, No Drawings

HIGH-PERFORMANCE PIEZOELECTRIC CERAMIC

The subject of the present invention is a piezoelectric ceramic material based on lead zirconate titanate, which is distinguished by an excellent thermal and temporal stability of the functional characteristics.

Materials with high piezoelectric activity along with high thermal and temporal stability (high Curie temperature, low temperature coefficients and low ageing rates) of the functional characteristics are required for piezoelectric ceramics to be used for sensors, in particular in automotive engineering (knocking sensors, rotation-rate sensors, reversing sensors).

Piezoelectric ceramics with large deformation defects and high Curie temperature are required for the furthering of development in the field of multilayer actuators.

Piezoelectric ceramics materials have long been made of compositions based on the solid solutions (mixed crystals) of lead zirconate ($PbZrO_3$) and lead titanate ($PbTiO_3$). A variety of modifications of the basic system is possible as a result of substitution and/or addition of metal ions in limited concentrations if the respective ions fulfil prerequisites with respect to valency, ionic radius and character of chemical bonding.

By substitution in the original sense of the word is to be understood the partial replacement of the $Pb^{2+}$ or $Zr^{4+}$ and $Ti^{4+}$ ions with ions of the same valency and similar ionic radii, such as $Ba^{2+}$, $Sr^{2+}$, $Mg^{2+}$ and $Sn^{4+}$. Such substitutions effect, on the one hand, an increase in the piezoelectric activity, but on the other hand, however, can also impair the thermal stability of the piezoelectric state.

A modification of the basic composition by doping with ions with a valency which is different from that of the original ions leads to a further diversification of the dielectric and electromechanical properties.

Ions from the "softener" group $La^{3+}$, $Bi^{3+}$, $Sb^{5+}$, $Nb^{5+}$ act in the basic system as donors and produce piezoelectric ceramics which are distinguished by a high dielectric constant and a high electromechanical activity, but are also characterised by high dielectric and mechanical losses as well as a dependency of the specific characteristics on strong electrical fields and mechanical loads.

A stabilisation of the piezoelectric ceramics based on lead zirconate titanate results from the doping with ions from the "hardener" group $K^+$, $Fe^{3+}$, $Al^{3+}$: these ions act as acceptors and, in interacting with the ions of the basic system, effect a reduction of the dielectric and mechanical losses, but lead to a reduction in the dielectric constant, piezoelectric activity and specific electrical resistance.

As a result of coupled substitution of ions from the group of the "softeners" with ions from the group of the "hardeners", it is, on the other hand, possible clearly to increase the stability of piezoelectric ceramics based on lead zirconate titanate whilst maintaining the piezoelectric activity and the high dielectric constant.

In conclusion, attempts have been made to do justice to the increased demands of the practical application of piezoelectric ceramics by means of multi-component systems, in which lead-containing ion complexes ("complex compounds") with the general formulation $PbB'_{1-\alpha}B''_{\alpha}O_3$, with B': 5-valent or 6-valent cations and B': 2-valent cations ($\alpha=\frac{1}{3}$ or $\frac{1}{2}$ depending on the valency of the cation B'), partially replace the ion complex $Pb^{2+}(Zr^{4+}, Ti^{4+})O_3$.

As a result of substitution of one or more of the complex compounds, which are also known as so-called relaxor-ferroelectrics, single-phase multi-component systems (for example as ternary or quaternary solid solutions) with perovskite structure result.

The substitution by lead-free compounds with perovskite structure, such as $BiFeO_3$, $KNbO_3$, $NaNbO_3$, $Na_{0.5}Bi_{0.5}TiO_3$ also leads to improvement in the properties of lead zirconate titanate ceramics.

These piezoelectric ceramics belong to the large family of (ceramic) ferroelectrics. Lead-free compositions such as $(K, Na)NbO_3$, $(Sr_{1-x}Ba_x)Nb_2O_6$ are also known as ceramic ferroelectrics.

In all, there exists, as a results of the widest variety of modifications of the basic system of the solid solutions of lead zirconate titanate, a large multiplicity of compositions with which it has been possible in many cases to realise a specification of the dielectric and electromechanical properties of piezoelectric materials for different transformer functions that is suitable for the respective use.

From 1 Eyraud, L., Eyraud, P., Mathieu, J. C., Claudel, B. "Effect of Simultaneous Heterovalent Substitutions on Both Cationic Sites on the Electrical Conductivity and Ageing of PZT Type Ceramics" (Ferroelectrics 50(1983) 103-1 10), 2 Eyraud, L., Eyraud, P., Claudel, B. "Influence of Simultaneous Heterovalent Substitutions in Both Cationic Sites on the Ferroelectric Properties of PZT Type Ceramics" (J. Solid State Chem. 53(1984)266–272), 3 Ohenassion, H., Gonnard, P., Troccaz, L., Eyraud, L., Eyraud, P. "Caracterisation de la stabilité d'un element piézoélectrique du type PZT sous compression uniaxiale rapide" (Revue Phys. Appl. 18(1983)479–486), and 4 Eyraud, L., Eyraud, P., Bauer, F. "Current Research in the Field of PZT Ceramics and Ferroelectric" (Polymers Adv. Cer. Mat. 1(1986)3, 223–231) is known the series of compositions

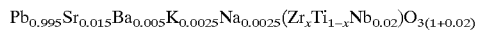

$Pb_{0.995}Sr_{0.015}Ba_{0.005}K_{0.0025}Na_{0.0025}(Zr_xTi_{1-x}Nb_{0.02})O_{3(1+0.02)}$ x=0.52–0.54

The solid compositions were prepared unconventionally by oxalate mixed precipitation in a wet-chemical process. The aim of these investigations was the preparation of compositions with very low electrical conductivity as a result of compensation of the valency of heterovalent substituents, and ultimately in the stabilisation of the functional properties with respect to comparatively great mechanical loads. The optimal concentration of the substituents was found by trial and error, and as the most stable composition with respect to the mechanical loading capacity emerged the formulation with the $Zr^{4+}$ content x=0.53. The compositions are characterised in 3 and 4. The stability criterion for these compositions was the resistance with respect to mechanical load. Details about the Curie temperature, temperature coefficients and ageing rates were not given. The optimal sintering temperature was given as 1230° C. The wet-chemical preparation used in these works in order to prepare the compounds can be converted to a commercial scale only at considerable expense.

The underlying object of the present invention has been to prepare modified piezoelectric ceramics based on lead zirconate titanate with high depolarisation strength in the case of high mechanical (impact) loads (for gas igniters) and in particular with low temperature coefficients and ageing rates of the functional characteristics, high Curie temperature (for sensors) and large deformation effect (for actuators).

In this connection, these piezoelectric ceramics are to be able to be synthesised by way of the conventional mixed-oxide route and sintered at temperatures below 1150° C.

This object has been achieved by a piezoelectric ceramic material based on lead zirconate titanate having the characterising features of the first or second claim. Preferred developments are characterised in the subclaims.

Surprisingly, it has been established that, in the case of lead zirconate titanate (with perovskite structure $A^{2+}B^{4+}O_3$), the desired stabilisation of the materials can be achieved, and simultaneously the reduction of the sintering temperature can be rendered possible, by partial substitution with ferroelectrically active compounds.

In accordance with the invention, in order to do this, alkaline earth metals, preferably $Sr^{2+}$ and/or $Ba^{2+}$, alkali metals $K^+$, $Na^+$, and metals $Nb^{5+}$, $Sb^{5+}$, $Ta^{5+}$, known per se in modifications of lead zirconate titanate (perovskite structure $A^{2+}B^{4+}O_3$), are built in stoichiometrically by way of ternary or quaternary solid solutions by way of lead-free compounds having the general composition $$A^{1+}B^{5+}O_3 \text{ or}$$

$$A^{2+}B'_{0.25}{}^{1+}B''_{0.75}{}^{5+}O_3$$

for heterovalent ion combinations (with respect to $A^{2+}B^{4+}O_3$) with per-ovskite structure, and possibly in combination with an alkaline earth niobate $(Ba_{1-x}Sr_x)_2Nb_2O_7$ (pyrochlore type). If appropriate, in order to increase the piezoelectric activity of the compositions in accordance with the invention, it is also possible to work with an excess of "softener" ions (non stoichiometry<1% by weight).

The general formulation of the ternary or quaternary solid solutions formed in accordance with the invention in this way is:

$$\{(1-u)Pb(Zr_xTi_{1-x})O_3 \cdot uA^{2+}(B'_{0.25}{}^{1+}B''_{0.75}{}^{5+})O_3\} + wMe_2^{5+}O_5 \quad \text{Type 1}$$

$$(1u-v)Pb(Zr_xTi_{1-x})O_3 - uA^{1+}B^{5+}O_3 - v(SR_{1-y}Ba_y)_2Nb_2O_7 \quad \text{Type 2}$$

In addition, a combination of alkaline earth metal ions, or the $Sr^{2+}$ and $Ba^{2+}$ ions in a certain concentration ratio, preferably the combinations $Sr_{0.7}Ba_{0.3}$, $Sr_{0.75}Ba_{0.25}$, or $Sr_{0.8}Ba_{0.2}$, particularly the combination $Sr_{0.75}Ba_{0.25}$, can stand for the cation $A^{2+}$ in Type 1, and the cation $A^{1+}$ in Type 2 can be represented by $K^+$, $Na^+$ in a certain concentration ratio, preferably by the combinations $K_{0.4}Na_{0.6}$, $K_{0.45}Na_{0.55}$, $K_{0.5}Na_{0.55}$, $K_{0.55}Na_{0.45}$, $K_{0.6}Na_{0.4}$, particularly preferably by the combination $K_{0.5}Na_{0.5}$.

The ceramic materials of Type 1 in accordance with the invention can be obtained by modification of lead zirconate titanate with complex, lead-free perovskites having the general composition $A^{2+}B'_{0.25}{}^{1+}B''_{0.75}{}^{5+}O_3$ (compound of alkaline earth metal ions, preferably $Ba^{2+}$ and/or $Sr^{2+}$ in combinations of alkali ions B'=alkali metal such as $K^+$ or $Na^+$ with 5-valent metal ions $B''^{5+}$=Nb, Ta, Sb), wherein 40≦x≦0.55

0<u≦0.10, and

0≦w≦1% by weight $Me^{5+}=Nb^{5+}, Ta^{5+}, Sb^{5+}$.

Type 2 in accordance with the invention can be obtained by modification of lead zirconate titanate with double oxides (perovskite) having the general composition $A^{1+}B^{5+}O_3$ of alkali metals, preferably of $K^+$ and/or $Na^+$, with pentavalent metals, for example with the metal ions $Nb^{5+}$, $Ta^{5+}$, $Sb^{5+}$, preferably with $Nb^{5+}$, in combination with an alkaline earth niobate of the pyrochlore type, preferably with a $(Ba_{1-x}Sr_x)_2Nb_2O_7$, wherein 0.40≦x≦0.55

0<u,v≦0.05, and

0≦y≦1.0.

Surprisingly, it has been established that the ceramic materials in accordance with the invention are distinguished by an excellent thermal and temporal stability of the functional characteristics. In this connection, the ceramic materials in accordance with the invention are distinguished by the following stability criteria:

| | |
|---|---|
| temperature coefficients | $TK_\epsilon < 3 \cdot 10^{-3} \, K^{-1}$ |
| | $Tk_k < 1 \cdot 10^{-1} \, K^{-1}$ |
| ageing rates | $C_\epsilon < 1 \cdot 10^{-2}$/decade |
| | $C_k < 5 \cdot 10^{-3}$/decade |
| Curie temperature | $T_c > 300°$ C. |
| change in potential in the case of repeated mechanical loading ($E_{pot}$ = 30 mW$_s$ = 250 mm height of fall of a ball weighing 11.8 g, after 1000 impacts) | $\Delta U/U < 3\%$ |

The ternary and quaternary solid solutions with heterovalent substituents (ion combinations with charge compensation) in accordance with the invention can be prepared as a stoichiometric, single-phase composition by way of the conventional route of the so-called mixed oxide technique in total synthesis.

Surprisingly, the ceramics prepared in this way sinter at temperatures below 1150° C., so that evaporation of PbO is substantially counteracted.

Materials with low sintering temperature, large expansion effect and high Curie temperature that are suitable even for multilayer actuators are available in certain composition ranges with the materials in accordance with the invention.

The materials in accordance with the invention are distinguished in particular by low ageing rates and temperature coefficients of the functional characteristics and are therefore particularly suitable for sensors.

On account of their high depolarisation strength with repeated mechanical impact loading, the materials in accordance with the invention are also suitable for ignition elements.

The stabilised piezoelectric ceramic materials in accordance with the invention with high piezoelectric activity can preferably be used for the sensor technology and actuator technology and in certain cases for ignition elements.

The following examples are intended to explain the invention without, however, restricting it:

Ternary solid solutions Type 1

EXAMPLE 1

The following compound was prepared in accordance with the invention:

$$0.98Pb(Zr_{0.52}Ti_{0.48})O_3 - 0.02Sr(K_{0.25}Nb_{0.75})O_3$$

In order to do this, the raw materials, as metal oxides, or metal carbonates or metal niobates, were weighed according to the stoichiometric composition and mixed and ground in a suitable medium in a ball mill over a period of time of 10 h. Subsequently, the mixture was dried, calcined at a temperature of 850° C., finely ground, granulated in a spray drier and then pressed under a pressure of 100 Mpa to form disc-shaped test samples. The test samples were then dense-sintered at 1120° C. with a dwell time of 1 h. Round discs with a diameter of 10 mm and a thickness of 1 mm were obtained.

After metallisation by burning in of a silver screen printing paste and polarisation with a voltage of 2.5 kV over a time of 5 mins at a temperature of 100° C., the functional characteristics were established on the test samples obtained in this way. In order to do this, the following measuring device, among others, was used:

Impedance Analyser HP 4194 A for measuring the capacitance (dielectric constant) and the electromechanical characteristic $k_p$ according to the resonator measuring process in accordance with DIN IEC 483.

For the test sample in accordance with Example 1, the following measured values resulted:

| | |
|---|---|
| $\epsilon_{33}^T/\epsilon_0$ | 1989 |
| $\tan\delta$ | 0.012 |
| $T_c$ | 347.3° C. |
| $k_p$ | 0.63 |
| $d_{33}$ | $440 \cdot 10^{-12}$ m/V |
| $TK_\epsilon$ | $2.5 \cdot 10^{-3}$ K$^{-1}$ |
| $Tk_k$ | $-5.2 \cdot 10^{-4}$ K$^{-1}$ |
| $C_\epsilon$ | $-2.9 \cdot 10^{-3}$/decade |
| $C_k$ | $1.7 \cdot 10^{-3}$/decade |
| $T_s$ | 1120° C. |

EXAMPLE 2

The compound:

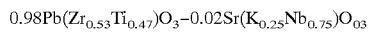
0.98Pb(Zr$_{0.53}$Ti$_{0.47}$)O$_3$–0.02Sr(K$_{0.25}$Nb$_{0.75}$)O$_{03}$ was prepared as described in Example 1.

For the test sample in accordance with Example 2, the following measured values resulted:

| | |
|---|---|
| $\epsilon_{33}^T/\epsilon_0$ | 2220 |
| $\tan\delta$ | 0.015 |
| $T_c$ | 331.1° C. |
| $k_p$ | 0.63 |
| $d_{33}$ | $475 \cdot 10^{-12}$ m/V |
| $TK_\epsilon$ | $1.9 \cdot 10^{-3}$ K$^{-1}$ |
| $Tk_k$ | $-5.9 \cdot 10^{-4}$ K$^{-1}$ |
| $C_\epsilon$ | $-9.4 \cdot 10^{-3}$/decade |
| $C_k$ | $2.6 \cdot 10^{-3}$/decade |
| $T_s$ | 1120° C. |

Quaternary solid solutions Type 2

EXAMPLE 3

The compound:

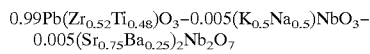
0.99Pb(Zr$_{0.52}$Ti$_{0.48}$)O$_3$–0.005(K$_{0.5}$Na$_{0.5}$)NbO$_3$–
0.005(Sr$_{0.75}$Ba$_{0.25}$)$_2$Nb$_2$O$_7$ was prepared as described in Example 1.

For the test sample in accordance with Example 3, the following measured values resulted:

| | |
|---|---|
| $\epsilon_{33}^T/\epsilon_0$ | 1926 |
| $\tan\delta$ | 0.0125 |
| $T_c$ | 347.5° C. |
| $k_p$ | 0.64 |
| $d_{33}$ | $452 \cdot 10^{-12}$ m/V |
| $TK_\epsilon$ | $3.0 \cdot 10^{-3}$ K$^{-1}$ |
| $Tk_k$ | $-5.6 \cdot 10^{-4}$ K$^{-1}$ |
| $C_\epsilon$ | $-6.2 \cdot 10^{-3}$/decade |
| $C_k$ | $0.7 \cdot 10^{-3}$/decade |
| $T_s$ | 1120 |

What is claimed is:

1. Piezoelectric ceramic material based on lead zirconate titanate, characterised in that it corresponds to the general formulation:

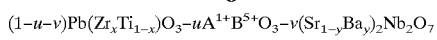
$(1-u-v)$Pb(Zr$_x$Ti$_{1-x}$)O$_3$–$u$A$^{1+}$B$^{5+}$O$_3$–$v$(Sr$_{1-y}$Ba$_y$)$_2$Nb$_2$O$_7$ wherein
A$^{1+}$ stands for alkali metal ions,
B$^{5+}$ stands for a pentavalent metal ion from the series Nb, Ta and Sb, and x, y, u and v have the following definitions:

$0.40 \leq x \leq 0.55$, $0 \leq y \leq 1.0$, and $0 < u, v \leq 0.05$.

2. Piezoelectric ceramic material according to claim 1 wherein the cation A$^{1+}$ is a combination of K$^+$ and Na$^+$ ions.

3. The piezoelectric ceramic material of claim 1 wherein A$^{1+}$ is one selected from the group consisting of Na$^+$, K$^+$, and mixtures thereof.

4. The piezoelectric ceramic material of claim 3 wherein A$^{1+}$ is one selected from the group consisting of K$_{0.4}$Na$_{0.6}$, K$_{0.45}$Na$_{0.55}$, K$_{0.5}$Na$_{0.5}$, K$_{0.55}$Na$_{0.45}$, and K$_{0.6}$Na$_{0.4}$.

5. The piezoelectric ceramic material of claim 3 wherein A$^{1+}$ is K$_{0.5}$Na$_{0.5}$.

6. The piezoelectric ceramic material of claim 1 wherein B$^{5+}$ is Nb.

7. Piezoelectric ceramic material according to claim 1, characterised in that it corresponds to the formula:

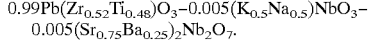
0.99Pb(Zr$_{0.52}$Ti$_{0.48}$)O$_3$–0.005(K$_{0.5}$Na$_{0.5}$)NbO$_3$–
0.005(Sr$_{0.75}$Ba$_{0.25}$)$_2$Nb$_2$O$_7$.

8. A piezoelectric ceramic material characterised in that it corresponds to the formula

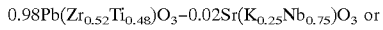
0.98Pb(Zr$_{0.52}$Ti$_{0.48}$)O$_3$–0.02Sr(K$_{0.25}$Nb$_{0.75}$)O$_3$ or

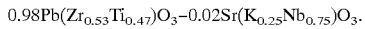
0.98Pb(Zr$_{0.53}$Ti$_{0.47}$)O$_3$–0.02Sr(K$_{0.25}$Nb$_{0.75}$)O$_3$.

9. A method for the preparation of a piezoelectric ceramic material characterised in that said material corresponds to the general formulation:

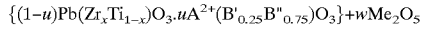
$\{(1-u)$Pb(Zr$_x$Ti$_{1-x}$)O$_3 \cdot u$A$^{2+}$(B'$_{0.25}$B''$_{0.75}$)O$_3\}+w$Me$_2$O$_5$ wherein
A$^{2+}$ stands for alkaline earth metal ions
B' stands for an alkali metal
B' and Me each stand for a pentavalent metal from the series Nb, Ta, and Sb, and x, u, and w have the following definitions:

$0.40 \leq x \leq 0.55$, $0 < u < 0.10$, and $0 \leq w \leq 1\%$ by weight, said method comprising the steps of:
a. providing a mixture of one or more of the oxides, carbonates, or niobates of alkaline earth metals or alkali metals; and oxides or carbonates of Nb, Ta, and Sb, such that the ratios of said metals are the same as the stoichiometric ratios of the metals in the desired piezoelectric ceramic material;
b. grinding said mixture;
c. drying and calcining the material of step (b);
d. forming the material of step (c) into test samples; and
e. sintering the test samples of step (d) at a temperature below 1150° C.

10. A sensor comprising a piezoelectric ceramic material characterised in that said material corresponds to the general formulation:

(a) $\{(1-u)Pb(Zr_xTi_{1-x})O_3 \cdot uA^{2+}(B'_{0.25}B''_{0.75})O_3\}+wMe_2O_5$ wherein
$A^{2+}$ stands for alkaline earth metal ions,
B' stands for an alkali metal,
B" and Me each stand for a pentavalent metal from the series Nb, Ta, and Sb, and x, a, and w have the following definitions:

$0.40 \leq x \leq 0.55$, $0 < u < 0.10$, and $0 \leq w \leq 1\%$ by weight or (b) $(1-u-v)Pb(Zr_xTi_{1-x})O_3-uA^{1+}B^{5+}O_3-v(Sr_{1-y}Ba_y)_2Nb_2O_7$ wherein
$A^{1+}$ stands for alkali metal ions,
$B^{5+}$ stands for a pentavalent metal ion from the series Nb, Ta and Sb, and x, y, u and v have the following definitions:

$0.40 \leq x \leq 0.55$, $0 \leq y \leq 1.0$, and $0 < u, v \leq 0.05$.

11. An actuator comprising a piezoelectric ceramic material characterised in that said material corresponds to the general formulation:

(a) $\{(1-u)Pb(Zr_xTi_{1-x})O_3 \cdot uA^{2+}(B'_{0.25}B''_{0.75})O_3\}+wMe_2O_5$ wherein
$A^{2+}$ stands for alkaline earth metal ions,
B' stands for an alkali metal
B" and Me each stand for a pentavalent metal from the series Nb, Ta, and Sb, and x, u, and w have the following definitions:

$0.40 \leq x \leq 0.55$, $0 < u < 0.10$, and $0 \leq w \leq 1\%$ by weight or (b) $(1-u-v)Pb(Zr_xTi_{1-x})O_3-uA^{1+}B^{5+}O_3-v(Sr_{1-y}Ba_y)_2Nb_2O_7$ wherein
$A^{1+}$ stands for alkali metal ions,
$B^{5+}$ stands for a pentavalent metal ion from the series Nb, Ta and Sb, and x, y, u and v have the following definitions:

$0.40 \leq x \leq 0.55$, $0 \leq y \leq 1.0$, and $0 < u, v \leq 0.05$.

12. An ignition element comprising a piezoelectric ceramic material characterised in that said material corresponds to the general formulation:

(a) $\{(1-u)Pb(Zr_xTi_{1-x})O_3 \cdot uA^{2+}(B'_{0.25}B''_{0.75})O_3\}+wMe_2O_5$ wherein
$A^{2+}$ stands for alkaline earth metal ions,
B' stands for an alkali metal,
B" and Me each stand for a pentavalent metal from the series Nb, Ta, and Sb, and x, u, and w have the following definitions:

$0.40 \leq x \leq 0.55$, $0 < u < 0.10$, and $0 \leq w \leq 1\%$ by weight or (b) $(1-u-v)Pb(Zr_xTi_{1-x})O_3-uA^{1+}B^{5+}O_3-v(Sr_{1-y}Ba_y)_2Nb_2O_7$ wherein
$A^+$ stands for alkali metal ions,
$B^{5+}$ stands for a pentavalent metal ion from the series Nb, Ta and Sb, and x, y, u and v have the following definitions:

$0.40 \leq x \leq 0.55$, $0 \leq y \leq 1.0$, and $0 < u, v < 0.05$.

* * * * *